United States Patent [19]

Seki et al.

[11] Patent Number: 4,627,991

[45] Date of Patent: Dec. 9, 1986

[54] METHOD FOR FORMING A PROTECTIVE FILM ON A SEMICONDUCTOR BODY

[75] Inventors: Yasukazu Seki, Tokyo; Noritada Sato; Osamu Ishiwata, both of Kanagawa, all of Japan

[73] Assignees: Fuji Electric Corporate Research & Development Co., Ltd.; Fuji Electric Co., Ltd., both of Kanagawa, Japan

[21] Appl. No.: 610,638

[22] Filed: May 16, 1984

[30] Foreign Application Priority Data

May 26, 1983 [JP] Japan ............................ 58-93221

[51] Int. Cl.$^4$ ............................................. B05D 3/06
[52] U.S. Cl. .............................. 427/39; 156/DIG. 86
[58] Field of Search ....... 156/613, DIG. 86, DIG. 64; 427/39, 82; 357/52

[56] References Cited

U.S. PATENT DOCUMENTS

| 4,362,766 | 12/1982 | Dannhäuser et al. | 427/39 |
| 4,365,107 | 12/1982 | Yamauchi | 156/DIG. 64 |
| 4,436,762 | 3/1984 | Lapatovich et al. | 427/39 |
| 4,438,183 | 3/1984 | Baughman et al. | 204/290 R X |

FOREIGN PATENT DOCUMENTS

| 0148349 | 5/1981 | German Democratic Rep. ... 427/39 |
| 0836202 | 6/1981 | U.S.S.R. ............................... 427/39 |

OTHER PUBLICATIONS

Ellipsometric Investigations of Boron-Rich Layers on Silicon, Busen et al, J. Electrochem. Soc. Solid State Sci., Mar. 1968, 291–299.

Primary Examiner—Hiram H. Bernstein
Attorney, Agent, or Firm—Brumbaugh, Graves, Donohue & Raymond

[57] ABSTRACT

In the representative embodiment of the invention described in the specification, a boron coating is applied to a semiconductor body having a protective film of a compound of the semiconductor material by heating the semiconductor body to a temperature below 400° C. in a vacuum chamber, introducing diborane gas into the chamber and causing a glow discharge between two electrodes in the chamber.

1 Claim, 3 Drawing Figures

U.S. Patent  Dec. 9, 1986  4,627,991
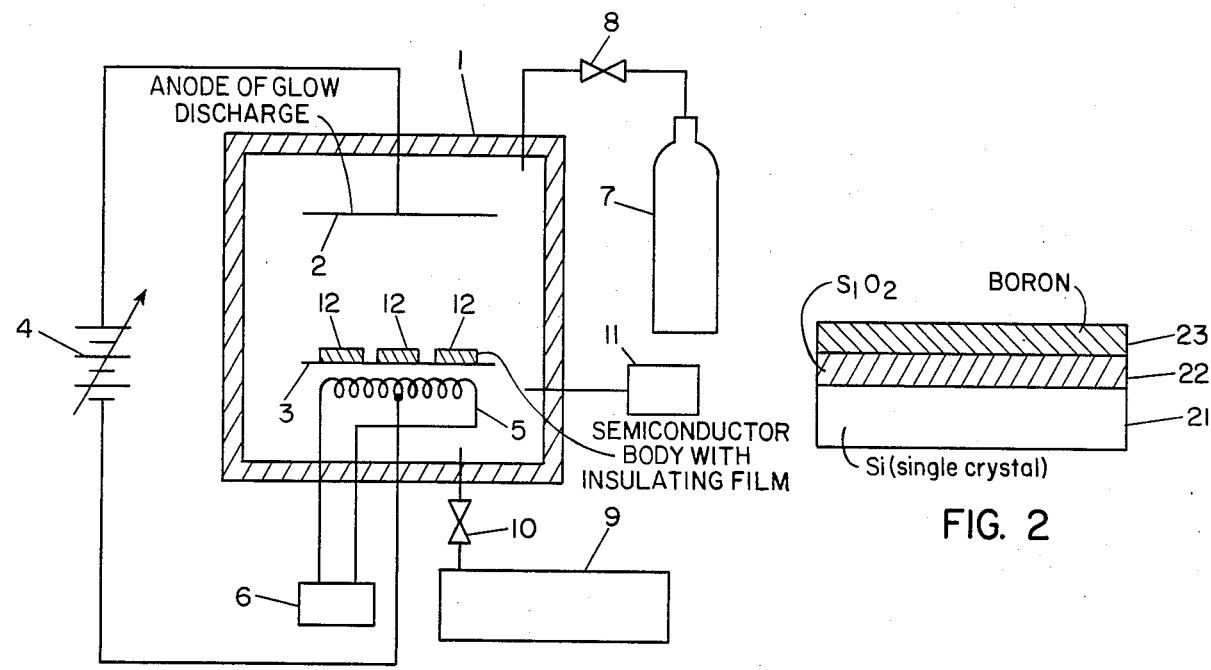
FIG. 1
FIG. 2
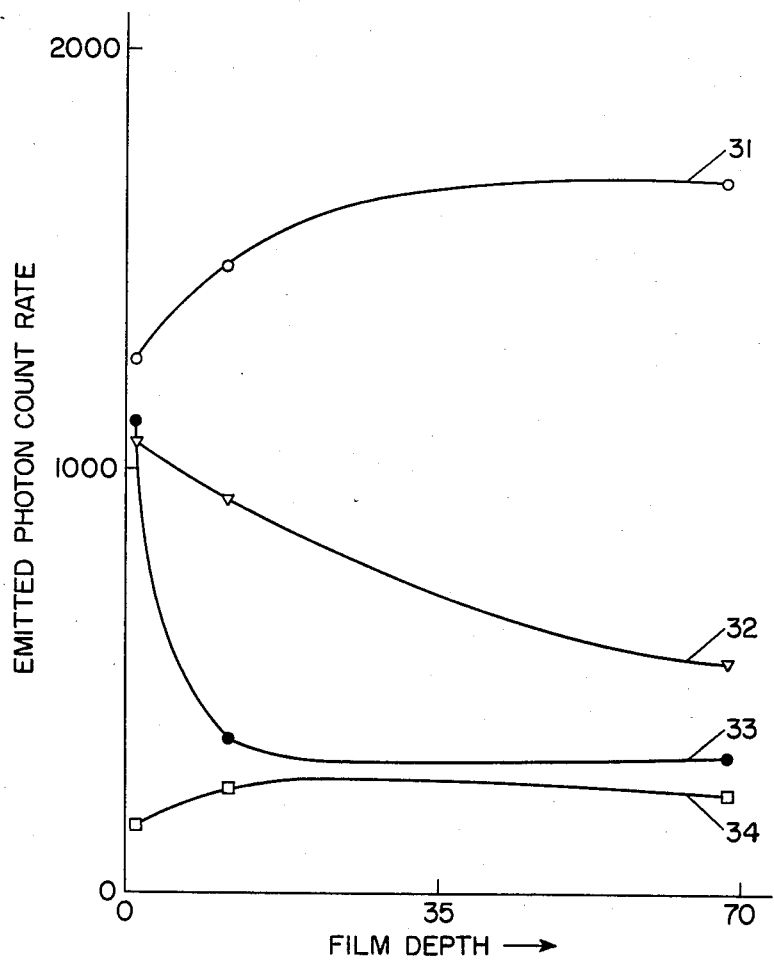
FIG. 3

METHOD FOR FORMING A PROTECTIVE FILM ON A SEMICONDUCTOR BODY

BACKGROUND OF THE INVENTION

This invention relates to methods for forming protective films and, more particularly, to a new and improved method for forming a protective film on the surface of a semiconductor body in order to prevent a semiconductor device from unwanted deterioration.

One example of a protective film on a semiconductor is an oxide which is formed at high temperature on a surface of a semiconductor substrate. Where a silicon crystal, for example, is used as a semiconductor substrate, an oxide film is produced by placing the silicon crystal in a water vapor while heating it to above 1000° C. This causes a chemical reaction at the silicon crystal surface to produce an oxide film thereon. Another example is a nitride film formed at high temperature. Such a nitride film is formed by placing a semiconductur substrate, for example, a silicon crystal, in a gas containing nitrogen, such as ammonia, while heating it at a high temperature of above 800° C. This causes a chemical reaction at the silicon crystal surface to provide a nitride film thereon.

One disadvantage of a silicon oxide ($SiO_2$) protective film is that it can react with hydrofluoric acid and then decompose. Therefore, an $SiO_2$ film cannot be employed when it is likely to come into contact with a solution or vapor containing hydrofluoric acid. On the other hand, a silicon nitride ($Si_3N_4$) film will decompose when exposed to heated concentrated phosphoric acid. Accordingly, an $Si_3N_4$ film cannot be used when it is likely to come into contact with a solution containing phosphoric acid or its vapor.

An object of the present invention is to provide a method for forming a chemically resistive protective film on a semiconductor body in order to avoid difficulty in subsequent surface treatments resulting from reaction of the protective film with chemicals used in manufacturing processes for semiconductor devices.

SUMMARY OF THE INVENTION

In accordance with the present invention, a semiconductor body having a surface film of a compound of a semiconductor element, such as an oxide film or nitride film, is heated in a vacuum chamber maintained at a high vacuum at a temperature below 400° C. and exposed to a diborane gas which is decomposed to deposit a boron film on the semiconductor compound film. The diborane gas is decomposed by generating a glow discharge in the chamber.

BRIEF DESCRIPTION OF THE DRAWINGS

In the accompanying drawings:

FIG. 1 is a schematic block diagram illustrating a typical form of apparatus for carrying out the present invention;

FIG. 2 is a cross-sectional view showing a silicon single crystal covered with a boron film according to one embodiment of the present invention; and FIG. 3 is a graphical representation showing the results of an analysis of the boron film applied in accordance with the invention, using the ESCA (Electron Spectroscopy for Chemical Analysis) method.

DESCRIPTION OF A PREFERRED EMBODIMENT

In the representative arrangement shown in the drawings, FIG. 1 illustrates a typical apparatus for carrying out the present invention which includes a vacuum chamber 1 in which an anode 2 and a cathode 3 are disposed on opposite sides and are connected to DC power supply 4. A heater 5 is attached to the cathode 3 and connected to a power supply 6. A diborane gas bomb 7 is connected to the vacuum chamber 1 through a valve 8, such as a mass flow controller, for the purpose of flow adjustment, and a vacuum exhaust system 9 is connected to the vacuum chamber 1 through a displacement adjusting valve 10. In addition, a vacuum gauge 11 is coupled to the vacuum chamber 1.

Semiconductor bodies 12 having an insulating protective film are placed on the cathode 3. The vacuum chamber is first evacuated through the vacuum exhaust system 9 to keep it at a high vacuum of about $1 \times 10^{-7}$ torr. Thereafter, the adjusting valve 10 is throttled to lower the exhaust rate of the exhaust system 9, and diborane gas is introduced into the chamber 1 through the gas flow controller 8 at the same time, thereby adjusting the pressure within the chamber to about 0.1 to 10 torr. The semiconductor bodies 12 are heated by the heater 5 to a temperature below 400° C., for example 300° C. Thereafter, a voltage is applied between electrodes 2 and 3 in a known manner to generate a glow discharge. This decomposes the diborane to deposit a boron film on the protective film of each semiconductor body 12.

As one example, illustrated in FIG. 2, a boron film 23 according to the present invention was formed on an $SiO_2$ film 22 which had been produced on a silicon single crystal 21 as an insulating protective film under the following conditions:

Substrate: p-type silicon single crystal, resisitivity of 10 to 30 KΩ cm, polished surface, thermal oxide film with thickness of 1 μm formed on surface.
Substrate temperature: 300° C.
Gas used: diborane ($B_2H_6$) diluted with hydrogen to 1000 ppm
Pressure at glow discharge: 2.0 torr
Electrode potential: 400 V. DC
Distance between electrodes: 50 mm
Discharge time: 60 minutes Although the semiconductor body having the boron film thus produced was exposed for one hour to ten types of chemical liquids or vapors, i.e., hydrofluoric acid, nitric acid, hydrofluoric acid + nitric acid, heated concentrated sulfuric acid, sulfuric acid, hydrochloric acid, aqua regia, potassium hydroxide, ammonia, trichloroethylene, and ethyl alcohol, it did not react with them or decompose at all. Accordingly, it was confirmed that the boron film provides good chemical resistance. Consequently, the protective film of a silicon wafer coated with a boron film will not be corroded if it is treated by such chemicals during etching. Moreover, the boron film is effective as a passivation film together with oxide or nitride film on which it is coated. Further, if a boron film is selectively formed on the insulating protective film, or is locally removed in an argon atmosphere by sputtering after covering the entire surface of the insulating protective film, it is useful as a mask having a good selective etching property. Also, the boron film serves as a mechanically protective film because it has a high hardness exceeded only by diamond.

In addition, since a protective film, such as an oxide film, is interposed between the boron film produced by the present invention and the semiconductor body, the boron does not vary the type or degree of conductivity of the semiconductor body by unwanted diffusion into the semiconductor.

FIG. 3 illustrates the result of an ESCA analysis of the boron film formed by the present invention by using an ESCA X-ray photoelectron spectroscope in which the x-axis of the drawing indicates a thickness direction from the surface of the boron film, and the y axis indicates counts of emitted photoelectrons per unit time. Using characteristic X-rays as an incident energy, ESCA is a method of performing elemental analysis from determination of shell levels by use of energy measurement of photoelectrons emitted from a sample. Curves 31, 32, 33 and 34 in FIG. 3 show the 1s state of boron, oxygen, carbon and nitrogen, respectively. The values of oxygen, carbon and nitrogen shown by curves 32, 33 and 34 are similar to the value obtained with the blank sample used in the analysis and they represent contaminations caused by the elements in air. There is no possibility that boron in the film is any other material.

In the described example the substrate temperature was 300° C. but this substrate temperature may be below 300° C. or above 300° C. However, in order to form the boron film quickly without interfering with the long life time or good properties of the crystal comprising the semiconductor body, it is preferable that the upper limit of the temperature is of the order of 300° C., and the substrate should be kept at 400° C. at most. The reason why a boron film with good quality may be produced at temperatures below 400° C. is believed to be that diborane is different from halides of boron that have been employed in known CVD techniques and the decomposition temperature of diborane in a plasma is low.

According to the present invention a boron film having high chemical resistance and wear resistance can be provided on a semiconductor body on which the protective film has been formed by the glow discharge decomposition of diborane, and the characteristics of the completed semiconductor device will not be affected because the type and degree of conductivity of the semiconductor body are not varied and the temperature of the semiconductor body during coating of the boron film is not excessive. Further, since the semiconductor body and the protective film formed thereon are not corroded by any chemicals in chemical treatments such as etching, increased freedom in the manufacture of semiconductor devices is possible and remarkable effects may be obtained.

We claim:

1. A method for forming a protective film on a semiconductor body having a surface film of a compound of the semiconductor material, comprising:

placing a semiconductor body with a surface film of a compound of said semiconductor material in a vacuum chamber maintained at a high vacuum, heating said semiconductor body to a temperature below about 400° C., introducing a diborane gas into said chamber, and generating a glow discharge in said chamber to thereby deposit a protective boron film containing boron on the surface film of the semiconductor.

* * * * *